United States Patent [19]

Tanno et al.

[11] 4,158,167
[45] Jun. 12, 1979

[54] APPARATUS AND METHOD FOR ELECTRICALLY TESTING MULTI-CORE CABLES AND AUTOMATICALLY INDICATING THE PRESENCE OF A DEFECTIVE CORE

[75] Inventors: Shogo Tanno, Nishinomiya; Masateru Hirose, Takarazuka, both of Japan

[73] Assignee: Dainichi-Nippon Cables, Ltd., Amagasaki, Japan

[21] Appl. No.: 845,364

[22] Filed: Oct. 25, 1977

[30] Foreign Application Priority Data

Oct. 26, 1976 [JP] Japan .............................. 51-128946

[51] Int. Cl.² .......................................... G01R 31/02
[52] U.S. Cl. ........................................ 324/51; 324/54
[58] Field of Search .......................... 324/51, 54, 73 R

[56] References Cited

U.S. PATENT DOCUMENTS

| | | | |
|---|---|---|---|
| 1,977,703 | 10/1934 | Swartwout | 324/54 X |
| 3,287,633 | 11/1966 | Mollo | 324/54 X |
| 3,473,112 | 10/1969 | Andrews | 324/51 |
| 3,988,666 | 10/1976 | Rowland et al. | 324/54 |

FOREIGN PATENT DOCUMENTS

2205286  8/1973  Fed. Rep. of Germany ............. 324/51

*Primary Examiner*—Gerard R. Strecker
*Attorney, Agent, or Firm*—W. G. Fasse; D. F. Gould

[57] ABSTRACT

An apparatus for electrically testing a multi-core cable terminated at both ends and including a plurality of insulated conductor cores, comprises a rotatably mounted disc having a peripheral surface formed of a plurality of notches each slightly larger than the core diameter for picking up a core and annular projections formed at both sides of the peripheral surface with annular grooves therebetween. The disc further includes an inlet for receiving and urging the cores adjacent to the disc toward the peripheral surface of the disc, whereby the cores are picked up by the notches one by one and transferred along the peripheral surface while each of the picked up cores is confined in the notches in a lid-like member. A counter counts the picked up cores. Fingers are coupled to the annular grooves for scooping the cores and removing the cores from the peripheral surface of the disc at an outlet. A bladed electrode is provided along the periphery of the disc for cutting only the insulation so as to be in contact with the conductor of a picked up core. An electrode vessel containing an electrically conductive fluid is arranged for immersing the cores at the opposite end for collectively rendering the cores conductive. A voltage source is coupled between the bladed electrode and the electrode vessel, and an electrical circuit for detecting a conductive state of a picked up core is connected between the bladed electrode and the electrode vessel for determining the continuity of any core.

19 Claims, 14 Drawing Figures

FIG. 3 (a)   FIG. 3 (b)
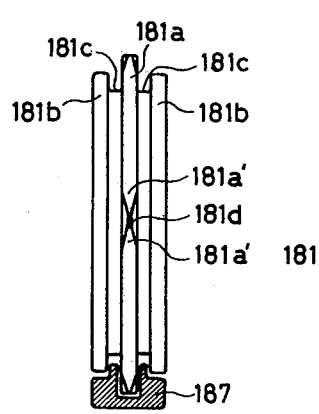
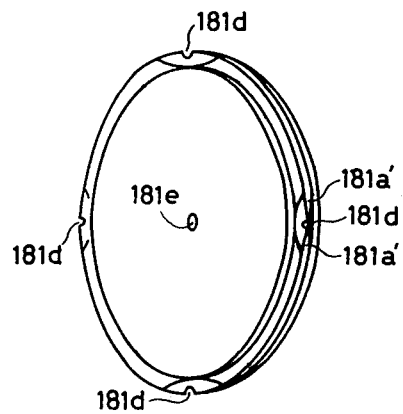
FIG. 4
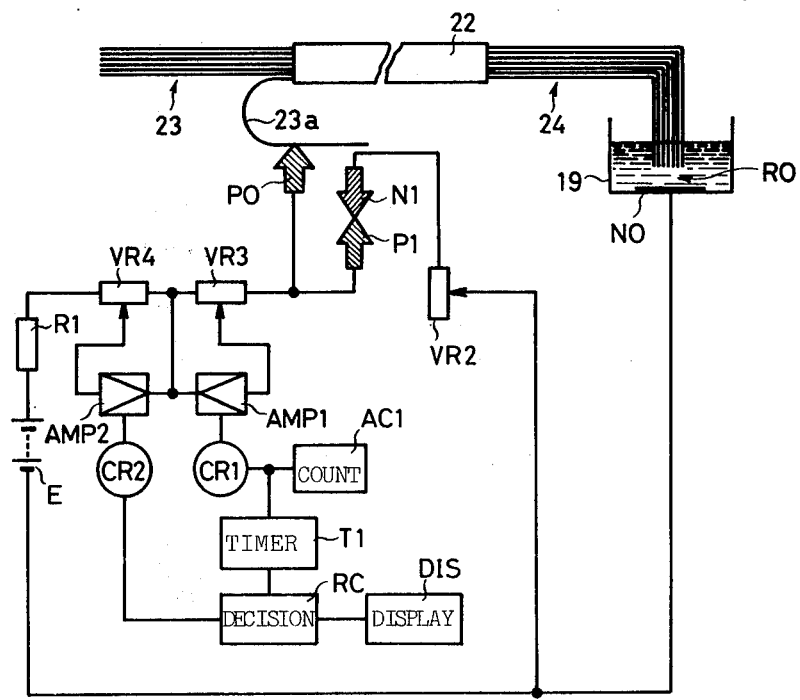

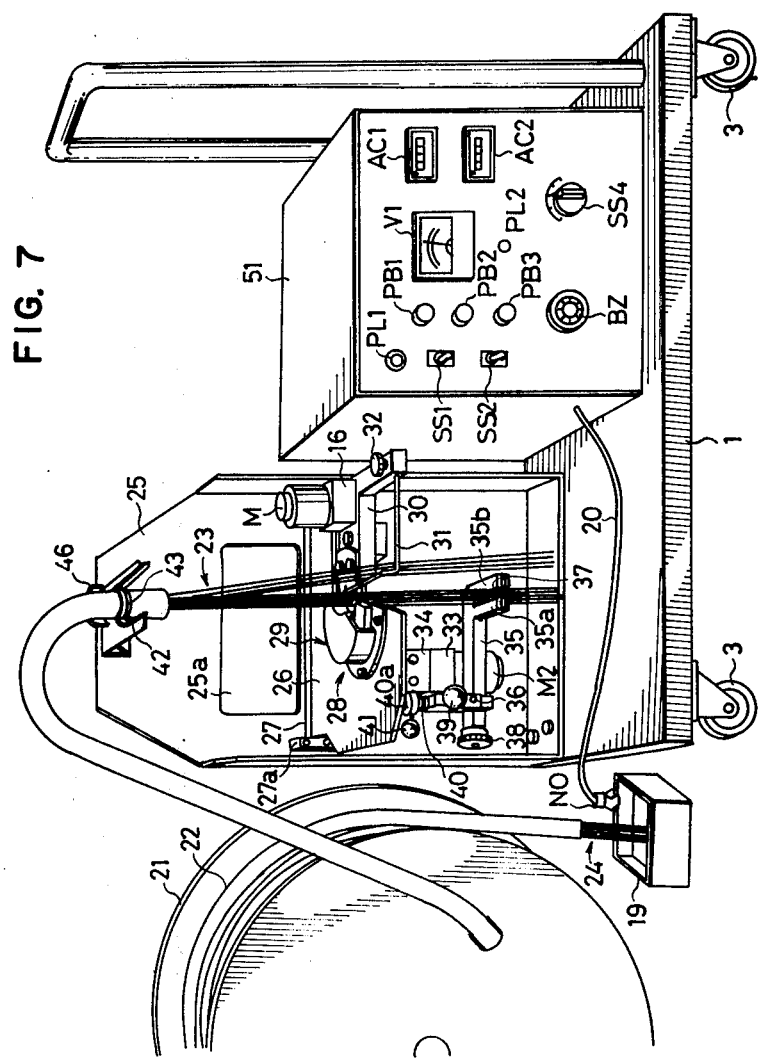

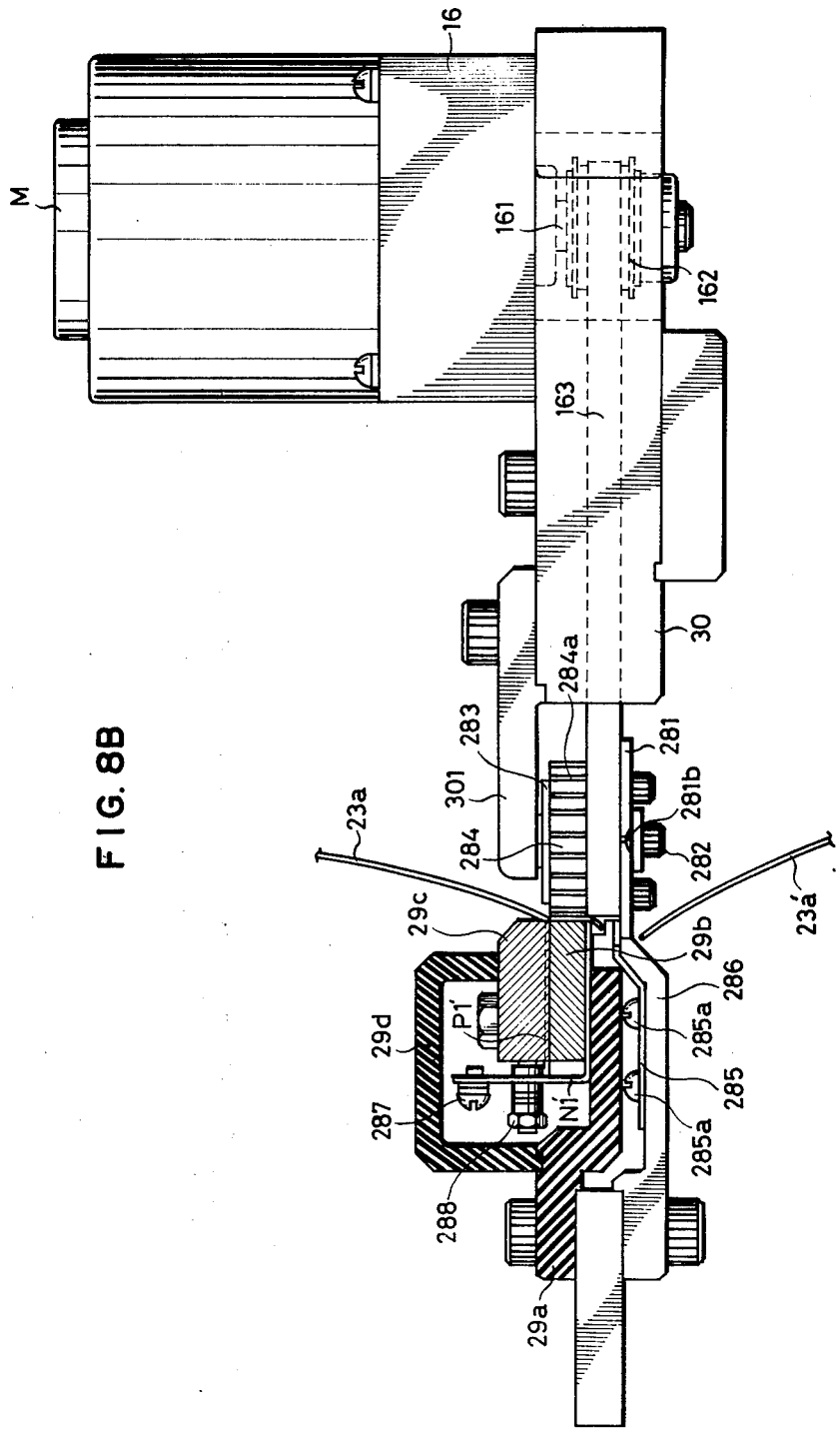

APPARATUS AND METHOD FOR ELECTRICALLY TESTING MULTI-CORE CABLES AND AUTOMATICALLY INDICATING THE PRESENCE OF A DEFECTIVE CORE

BACKGROUND OF THE INVENTION

1. Field of the Invention

This invention relates to an apparatus and method for electrically testing multi-core cables and more particularly it relates to testing the conductive state of each of the cores of a multi-core cable, such as a communication cable, having a number of cores, each comprising a conductor and an insulating cover.

2. Description of the Prior Art

Usually, a communication cable is constructed using as a structural unit a pair in which two cores are twisted together or a quad in which four cores are twisted together. Some local communication cables containing a number of cable circuits comprise as many as 2,400 to 3,200 pairs, i.e., 4,800 to 6,400 cores may be contained in a single cable. In the production of such communication cables, the cores have to be tested one by one in the intermediate or final stage of cable production to see if there is a break in any of the conductors, in order to guarantee the quality of each cable. Further, in order to carry out such tests, all the cores have to be stripped of their insulating covers at both ends of the cable.

However, it would require an enormous amount of time and labor to test the cores by successively selecting and separating a single core from a large group of cores as described above. Therefore, various attempts to mechanically or automatically carry out such discontinuity tests of multi-core cables (including other electrical tests) have heretofore been suggested and realized.

For example, there has been developed an apparatus comprising a measuring multi-pole connector or multi-pole insulated terminal stand having terminals to which the cores of a cable are once connected, whereupon the cores are successively automatically tested for their breaks or continuity by a measuring instrument, through said connector or terminal stand. However, carrying out tests by using such an apparatuses takes much time for preparation, connection and disconnection upon completion of the test. Hence, prior art devices fail to provide an efficient automatic testing. That is, the preparatory operation for removing the insulating covers from the cores or untwisting the cores and straightening them in order to connect the cores to the terminals on said connector, the operation for picking up the cores one by one for connection to the terminals or the after-operation for disconnecting the tested cores without damaging them cannot be performed except manually. As a result, these operations require a long time and the ratio which the net time required for inspection and measurement bears to the whole time is small. Thus, even if the measuring operation alone is automated, it would be impossible to improve the efficiency of operation drastically, since the picking and connecting operations which occupy the greater part of the process are not automatic.

SUMMARY OF THE INVENTION

An object of this invention is to solve the above described problems and provide a highly reliable electric testing method suited for automation and also an automatic electric testing apparatus, wherein for testing a multi-core cable, the need for applying particular treatments such as untwisting unit cores, such as pairs or quads, removing the insulating covers and connecting the cores to terminals or connectors, is eliminated so as to allow the individual cores to be directly tested for their continuity.

Another object of this invention is to achieve an automatic test by arranging, picking up, pickup confirming, measuring and decision stations in a series of operating regions.

A further object of the invention is to provide an automatic electric testing apparatus which is very compact and efficient.

According to the invention, the conductive state of each of the cores of a multi-core cable including a number of cores, such as a communication cable or a control cable, is individually detected, thereby to decide whether or not it is discontinuous. The process involves removing sheath from the both ends of such multi-core cable to take out the cores, collectively holding the cores at their near ends in mutually isolated relation while collectively rendering them conductive at their farther ends. Then, the collectively held near ends of said cores are urged against a movable member formed with a notch or notches having a size corresponding to the core diameter, whereby a core to be picked up is engaged with said notch. As the movable member is moved, a single core is separated and picked up from the group of cores at their near ends. At this point, whenever a core is picked up, a core pick up signal is provided. Subsequently, a current is caused to flow between the near end of said picked up core and its farther end collectively rendered conductive and a decision on discontinuity or continuity is made on the basis of the value of the current. In case where the core is discontinuous, the present apparatus automatically decides that such discontinuity is actually present on the basis of a core pickup detection signal and on the basis of the value of the current exhibiting discontinuity whereby defective cores will be automatically and individually indicated.

BRIEF DESCRIPTION OF THE DRAWINGS

FIGS. 3(a) and 3(b) show a diagrammatic view of a rotary disc in this embodiment;

FIG. 4 is a theoretical electric circuit diagram for the explanation of the operation of this embodiment;

FIG. 7 is a complete perspective view showing another embodiment of this invention;

FIGS. 8A and 8B are diagrammatic views showing the principal parts including a pickup unit of this further embodiment;

DESCRIPTION OF THE PREFERRED EMBODIMENTS

Figure 1:
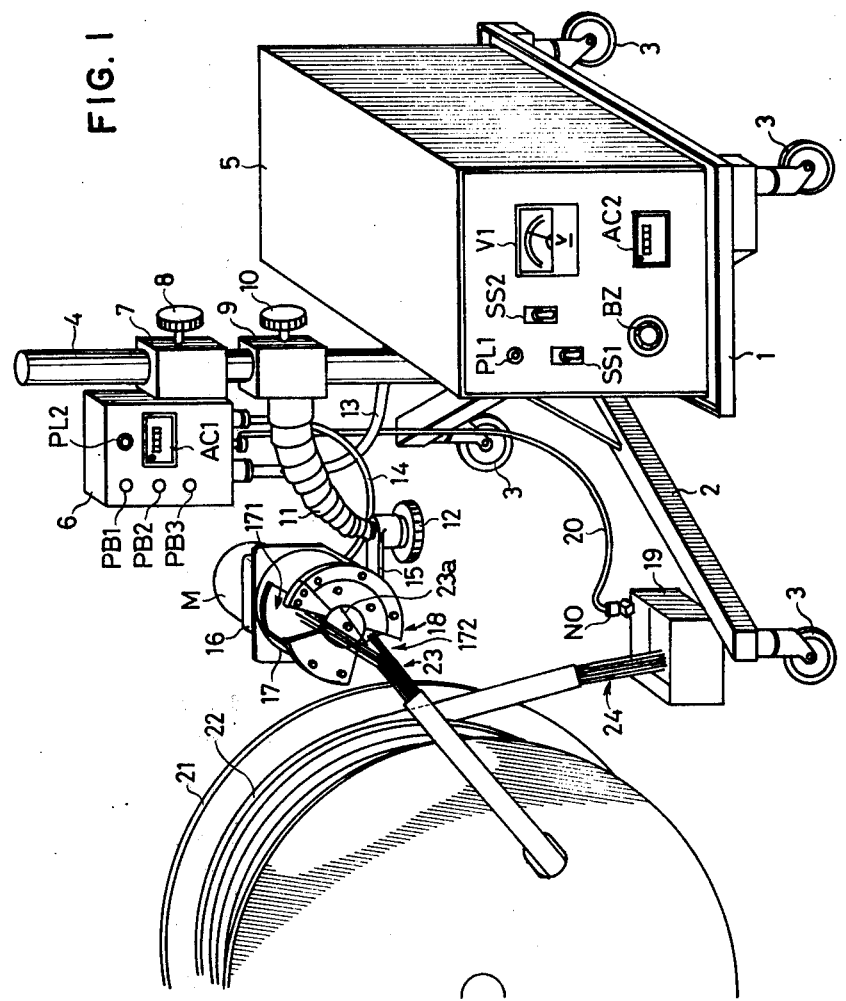
FIG. 1 is a complete perspective view showing an embodiment of this invention.

FIG. 1 is an entire perspective view showing an embodiment of the invention. In one arrangement, a table 1, together with a standard 4, are carried on legs 2 carried by casters 3 rendering said table 1 and standard 4 movable. Mounted on said table 1 is a box containing a power source unit 5. Disposed on the power source unit 5 is a power switch SS1 for turning on and off the power, a pilot lamp PL1 serving to indicate the power being turned on, a mode changeover switch SS2 for the changeover of the apparatus between a test mode in which the apparatus will not stop even if a discontinuity is detected and an automatic operation mode in which the apparatus will temporarily stop when a discontinuity is detected, a voltmeter V1 indicating the power source voltage, a counter AC2 for counting the number of broken cores, and a buzzer BZ serving to report the detection of a discontinuity. These components will be later described in more detail.

Further, at a predetermined position on said standard 4, an operating unit 6 is fixed by a block 7 slidably fitted on said standard 4 and by a set-screw 8. A flexible arm 11 is positioned and fixed to the standard 4 at a suitable height by a similar block 9 and a set-screw 10. The position or height of the operating unit 6 or flexible arm 11 can be adjusted according to the shape of a reel or drum on which a cable to be tested is wound. Disposed on the operating unit 6, as will be described in connection with operations to be later described, are a push-button switch PB1 used to turn on a pickup drive motor M, a push-button switch PB2 used to turn off said motor M, a reset push-button switch PB3 whereby after a discontinuity is detected a control circuit and a test circuit including said buzzer BZ to be later described are reset to be brought into a re-testing allowing state, a pilot lamp PL2 indicating said reset state, and a counter AC1 for counting the number of picked up or tested cores. The flexible arm 11 is constructed in a universal joint fashion by using, e.g., balls and short sleeve members holding said balls therebetween, the flexibility thereof being variable by a set-screw 12. Further, attached through a member 15 to the free end of said flexible arm 11 are pickup units 18 including the motor M, a speed reducer 16 for reducing the driving speed of said motor M and a cover 17, as will be later described in more detail.

An electrode vessel 19 made of an electrically conductive material for containing an electrically conductive liquid, for example, a solution of common salt or a common-salt-containing pasty substance, is part of the present apparatus. The electrode vessel 19 is provided with an electrode N0 which serves as a common electrode to be later described, in such a manner as, for example, to clamp said vessel 19. The common electrode N0 is connected to said operating unit 6 through a cable 20. Further, said power source unit 5 and said operating unit 6 are interconnected by a cable 13 and said operating unit 6 and said pickup unit 18 are interconnected by a cable 14. A cable 22 to be tested which is wound on a reel 21 is a multi-core cable including a common sheath and a plurality of cores each comprising a conductor and an insulating cover. One group of core ends 23 of this multi-core cable 22 is stripped of the sheath and brought to said pickup unit 18 while the other group of core ends 24 is immersed in the electrically conductive liquid in said electrode vessel 19 whereby it is collectively rendered conductive.

Figure 2:
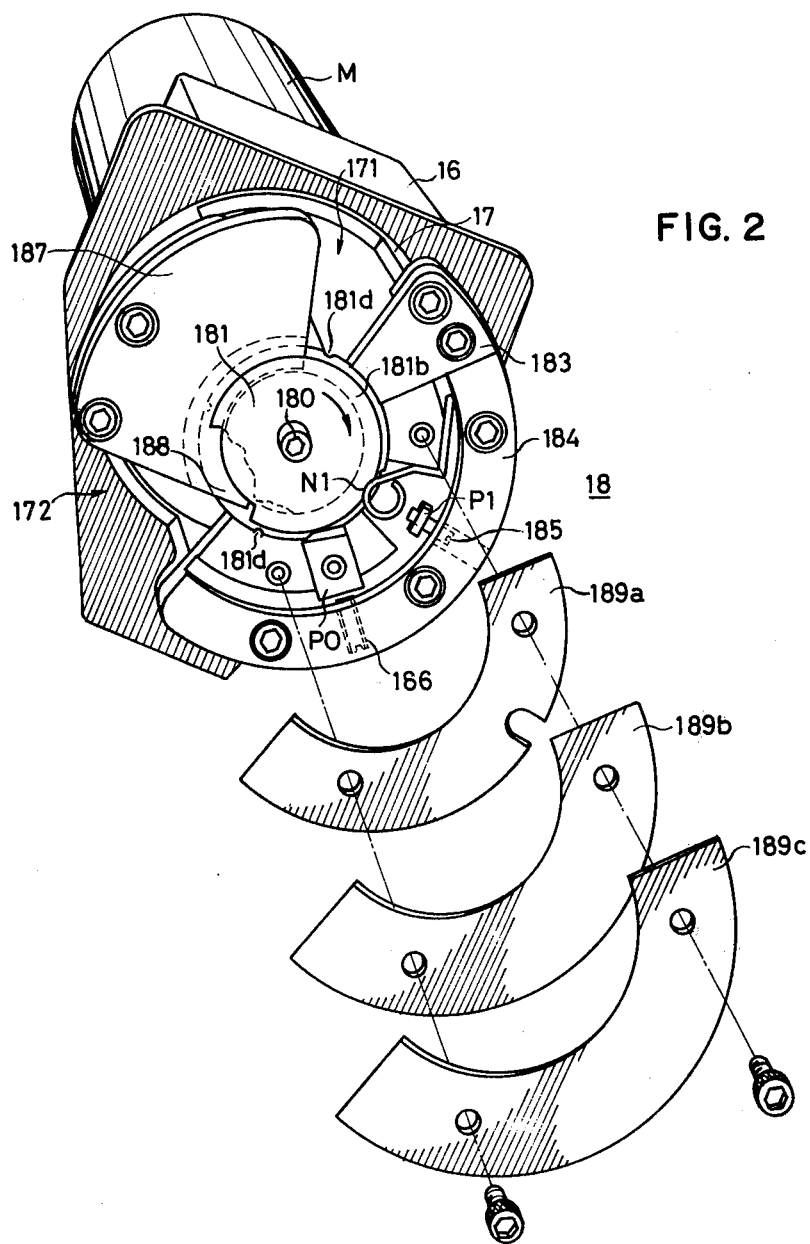
FIG. 2 is a detailed perspective view showing a pickup unit in this embodiment in a partially exploded view.

FIG. 2 is a perspective view showing the pickup unit 18, which forms a principal portion of the invention. FIG. 3 is a detailed view of a rotary disc 181. The unit 18 will now be described in more detail with reference to FIGS. 2 and 3. The speed of revolution of the motor M is reduced to a relatively low value by the speed reducer 16 and the rotation is transmitted to the rotary disc 181 covered with a cover 17. The rotary disc 181 is intended to separate and pick up the cores one by one from the group of core ends 23. The disc is fixedly fitted at its center of rotation 181e on the rotary shaft 180 of the speed reducer 16. The cover 17 is partly cut away. That is, the cover 17 is formed with a core-group charging port 171 for collectively holding said group of core ends 23 and bringing said group to the peripheral lateral surface of said rotary disc 181, and a core discharging port 172 for discharging cores picked up and tested by said rotary disc 181.

The rotary disc 181, as shown in detail in FIG. 3, is substantially centrally formed on its peripheral lateral surface with an annular projection 181a, which becomes a moving surface when rotating. On both sides of the annular projection 181a, the disc is formed with annular projections 181b, 181b and with annular grooves 181c, 181c defined therebetween. The circumference of the annular projection 181a is somewhat greater than those of the annular projections 181b, 181b, so that the annular projection 181a projects beyond the peripheral lateral surface of the rotary disc 181. The end edge of the annular projection 181a is formed with picking up notches 181d at positions which divide the circumference into four substantially equal parts. The number of equal parts into which it can be divided depends on the positions of the electrodes N1 and N0 to be later described. The ends 181a', 181a' of the annular projection 181a defining each of the pickup notches 181d are processed so that they are gradually thinned and rounded toward said pickup groove. Such processing is for the purpose of ensuring that cores to be picked up will be arrested by the core pickup notches 181d even if said cores are inclined with respect to the axis of the rotary disc.

Referring back to FIG. 2, disposed outwardly of the rotary disc 181 fixed to the rotary shaft 180 as described above are a core rataining block 183 and an insulating block 184 which are lid-like members, with a very small clearance defined between each member and the disc. The lid-like members, namely, the core retaining block 183 and insulating block 184 serve to prevent cores arrested by said pickup notches 181d from slipping off said grooves. Further, these blocks 183 and 184 are fixed to the end edge of the cover 17.

Disposed on said insulating block 184 is a spring-like electrode N1 for detecting whether or not a core has been taken into said pickup notches 181d. The spring-like electrode N1 has one end thereof fixed to said insulating block 184 and the other end swingable. Further, the other end of the spring-like electrode N1 is so arranged that it is normally fitted in the annular groove 181c of said rotary disc 181 and that upon detection of a core it is pushed outwardly beyond the annular groove 181c. Further, the insulating block 184 is provided with a fixed electrode P1 at a position where its front end can be contacted by the spring-like electrode N1 when the latter is pushed out in response to the detection of a core as described above. The fixed electrode P1 is provided at its rear end with an electrode position adjusting presser bolt 185 so as to adjust said contactable position according to the size of the core diameter.

A bladed electrode P0 is fixed to said insulating block 184, with its bladed portion directed toward the rotary disc 181. This bladed electrode P0 is intended to break the insulating cover on a core picked up by the rotary disc 181 so as to apply current to the conductor, the front end (bladed portion) thereof projecting toward the rotary disc 181 slightly beyond said block 184. The bladed electrode P0 is provided at its rear end with a bladed electrode adjusting presser bolt 186 for varying the projecting state according to the core diameter, etc. The fixed electrode P1 and the bladed electrode P0 are commonly connected by the internal circuit.

At the end edge of said cover 17, the core charging port 171 is defined by the core retaining block 183 and block 187, while on the side opposite to the core charging port 171 at the end edge of the cover 17, the core discharging port 172 is defined by the insulating block 184 and block 187. The side of said block 187 adjacent the core discharging port 172 is formed with a separator 188 for taking out cores transferred thereto as confined in the notches 181d of the rotary disc 181. The separator 188 is, e.g., comb-tooth-shaped and forms part of the block 187 shown in FIG. 3(a) and the comb-tooth-shaped portion is loosely fitted in the annular grooves 181c, 181c of the rotary disc 181. Therefore, cores confined in the notches 181d are scooped out of the latter and discharged at said core discharging port 172.

Insulating covers 189a, 189b and 189c are then successively applied to the electrically conductive portions including said spring-like electrode N1, fixed electrode P1 and bladed electrode P0. The insulating cover 189b is made, e.g., of rubber in order to protect said bladed electrode P0 from contact by inspected or tested cores.

In addition, said rotary disc 181 should be insulated from the cores in order that the discontinuous core may not be erroneously indicated to be a normal core when it is electrically contacted with the rotary disc to complete a circuit extending through the cover 17 and the grounded electrode N0.

The pickup unit 18 is constructed in this way and is fixed to the support member 15 at the end of a flexible arm 11, as described above.

FIG. 4 is an electric circuit diagram showing the principle of the invention. The operation will now be described with reference to FIGS. 1 to 3 and also to FIG. 4. First of all, the sheath of the multi-core cable 22 wound on the reel or drum 21, as shown in FIG. 1, is removed at both ends of the cable to take out the groups of core ends 23 and 24. Thereafter, the group of core ends 24 is immersed in an electrically conductive fluid in the electrode vessel 19 while the group of core ends 23 is put in said core-group charging port 171 of the pickup unit 18.

When the motor M is energized, the rotary disc is driven for rotation through the speed reducer 16, whereby, the rotary disc 181 is rotated with its peripheral surface contacting the group of core ends 23 collectively held as described above. As a result, a core 23a (FIG. 4) is picked up from the group of core ends 23 and enters a notch 181d. This core 23a is then confined in said notch by the core retaining block 183 and insulating block 184 and in this state it reaches the position of the spring-like electrode N1 with the rotation of the rotary disc 181.

When the picked-up core 23a reaches the position of the spring-like electrode N1, the latter is outwardly pushed by the core 23a into contact with the fixed electrode P1. Accordingly, a series closed circuit including a power source E, a resistor R1, variable resistors VR2, VR3 and VR4 the spring-like electrode N1 and fixed electrode P1 is completed. Therefore, an electric current flows through the pickup confirming variable resistor VR3. This current I1 is determined as follows.

$$I1 = \frac{E}{R1 + VR2 + VR3 + VR4} .$$

Therefore, a voltage across the variable resistor VR3 by virtue of the current I1 is applied to an amplifier AMP1, energizing a relay CR1 and simultaneously a relay CR2. The energization of the relay CR1 is confirmed by the closing of its normally open contact, and the number of picked-up cores is counted by the counter AC1. If no core is picked up by the rotary disc 181, there will be no contact between the spring-like electrode N1 and the fixed electrode P1 and hence no current flows, with the relay CR1 remaining deenergized.

As the rotary disc 181 continues rotating, the picked-up core 23a reaches the bladed electrode P0 for the continuity test. As a result, the bladed electrode P0 pierces the insulating cover on the core 23a until it contacts the core conductor. Accordingly, a series closed circuit including the power source E, resistor R1, variable resistors VR3 and VR4, bladed electrode P0, picked-up core 23a and electrode vessel 19 and hence common electrode N0 is completed. Therefore, a current flows through the variable resistor VR4 for confirmation of continuity. This current I2 is determined as follows.

$$I2 = \frac{E}{R1 + VR3 + VR4 + Rc + Ro} ,$$

where Rc is the core resistance of the picked-up core 23a and Ro is the resistance between the core 23a and the common electrode N0 in the electrode vessel 19. Generally, the core resistance Rc has an intrinsic value. For example, in the case of core diameters of 0.4 mm, 0.5 mm, 0.65 mm and 0.90 mm, the value is 70$\Omega$/500 m, 45$\Omega$/500 m, 26$\Omega$/50 m and 13$\Omega$/500 m, respectively. Therefore, depending upon whether the core resistance Rc is above or below a predetermined value, the continuity or discontinuity of the respective core is determined. Conversely, the continuity test is made by deciding whether said current value I2 is below or above a certain level. To this end, the variable resistor VR4 has an amplifier AMP2 connected thereto. The amplifier AMP2 has a suitably selected amplification factor, so that when said current value I2 exceeds a predetermined value, a relay CR2 associated therewith is energized. The energization of the relay CR2 is confirmed by the closing of its normally open contact. When the relay CR2 is energized, a decision circuit RC determines that the picked-up core 23a has the desired continuity.

Conversely, after the pickup of the core has been confirmed by the energization of the relay CR1, as described above, if the relay CR2 is not energized upon the lapse of a predetermined period of time fixed by a timer T1 energized by said relay CR1, then the decision circuit RC decides that the core 23a has a discontinuity, which decision is displayed by a display device DIS such as a buzzer.

Figure 5A:
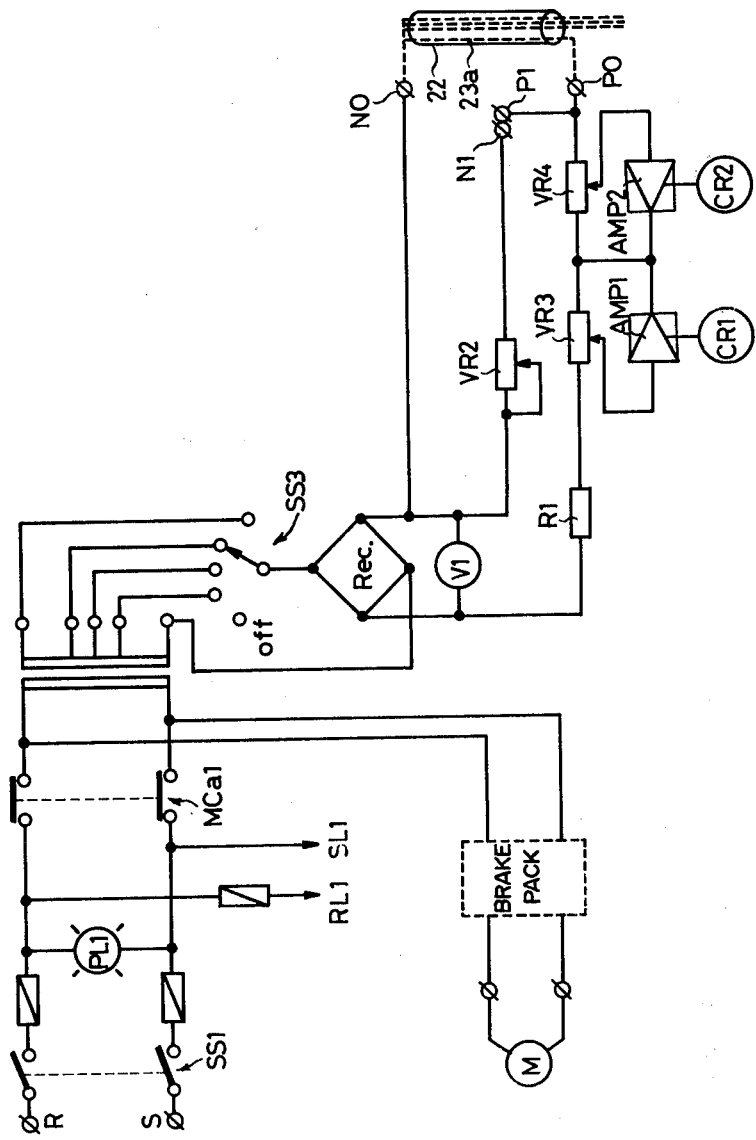
FIGS. 5A and 5B are more detailed electric circuit diagrams for this embodiment.
Figure 5B:
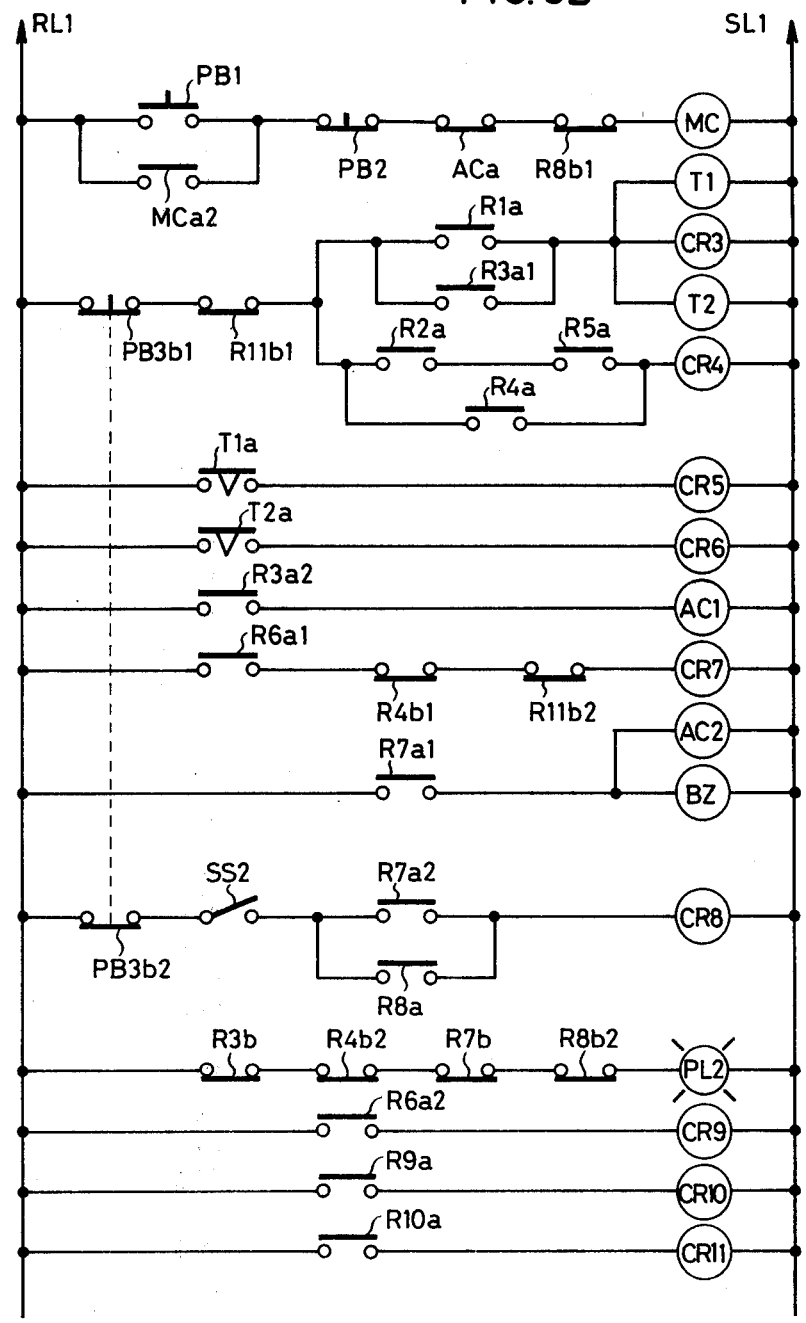

The operation will now be described in more detail with reference to FIGS. 5A and 5B.

Once the core ends 23 have been inserted into the port 171, the power switch SS1 is turned on. Accordingly, the pilot lamp PL1 is lighted to display that the power is turned on, and the pilot lamp PL2 is lighted to indicate that the control circuit is in a reset, initial state. Subsequently, a desired inspection voltage, e.g., of 75 V is set by an inspection voltage setting switch SS3 (FIG. 5A) located on the back of the power unit 5. Thereafter, it is decided by the mode changeover switch SS2 whether to select the "automatic stop mode" or not. The "automatic stop mode" operation will first be described. Then the push-button switch PB1 on the operating unit 6 is depressed. Accordingly, an electromagnetic relay (main relay) MC is energized to have its normally opened contacts MCa1, MCa2 closed. Therefore, power is applied to the motor M and the electromagnetic relay MC is self-retained. As a result, the motor is energized to rotate the rotary disc 181 connected thereto.

When the motor M is energized and the rotary disc 181 begins rotating, a core 23a (FIG. 4) is picked up from the group of core ends 23 by a notch 181d of said disc 181 and travels in accordance with the rotation thereof, as described above. The picked-up core 23a is moved to the spring-like electrode N1.

When the picked-up core 23a reaches the position of the spring-like electrode N1, the latter is urged against the fixed electrode P1 by said core 23a, so that, as described above, the relays CR1 and CR2 are energized. When the relay CR1 is energized, its normally open contact R1a is closed to energize the timers T1 and T2 and the relay CR3. Therefore, the timer T1 the selected time setting of which is about 0.05 sec. and the timer T2 the selected time setting of which is about 0.3-0.4 sec. begin their timing actions. Concurrently therewith, the normally open contacts R3a1 and R3a2 of the relay CR3 are closed, while the normally closed contact R3b is opened. Accordingly, the relay CR3 closes its holding circuit, the counter AC1 is energized and the pilot lamp PL2 is switched off. The counter AC1 steps "1" in response to said energization for counting the number of picked-up cores. Further, the pilot lamp PL2 indicates, by its being switched off, that a core has been picked up and that the control circuit or test circuit has started its operation.

Further, as the rotary disc 181 continues rotating, the contact established between the electrodes N1 and P1 by said picked-up core 23a is interrupted. Therefore, at this point of time, the relays CR1 and CR2 are deenergized. However, since the relay CR3 is energized in its holding circuit, the timers T1 and T2 remain energized. As a result, first, the timer T1 is turned on to have its T1a closed. Accordingly, the relay CR5 is energized to have its normally open contact R5a closed.

As the rotary disc 181 continues rotating, said core 23a is moved to the position of the bladed electrode P0. Therefore, the bladed electrode P0 pierces the insulating cover on the picked-up core 23a until it contacts the conductor thereof. As a result, the relay CR2 is energized, as described above. In this case, if the picked-up core 23a exhibits a discontinuity or said bladed electrode has not made perfect contact with the core conductor, the relay CR2 will remain deenergized.

As described above, normally the relay CR2 is energized and the normally open contact R2a is closed and R5a is closed, so that the relay CR4 is energized to have its normally open contact R4a closed and hence said relay CR4 is energized in its holding circuit. Thereafter, when the bladed electrode P0 releases the core conductor with the rotation of the rotary disc 181, the relay CR2 is deenergized. Further, the timer T2 is turned on to have its contact Ta2 closed and hence the relay CR6 is energized. As a relsult, its normally open contacts R6a1 and R6a2 closed. Accordingly, the relay CR9 is energized to have its normally open contact R10a closed and hence the relay CR11 is energized. These relays CR9, CR10 and CR11 are employed to gain time for treatment in the event of a discontinuity in the conductor and may be replaced by timer relays adapted to be energized in reponse to the energization of the relay CR6.

The energization of the relay CR11 opens its normally closed contacts R11b1 and R11b2 and, deenergizing said timers T1 and T2 and the relays CR3 and CR4. At this time, the relays CR7 and CR8 remain deenergized. Therefore, all the relays CR6 to CR11 are deenergized and the pilot lamp PL2 is lighted, thus establishing the initial state. The lighting of the pilot lamp PL2 indicates this initial state.

Next, in the case where the pickup of a core is not followed by the energization of the relay CR2 as in the case of a discontinuity, the timer T2 is turned on after said set time elapses. Therefore, its contact T2 is closed, energizing the relay CR6 to close its normally open contacts R6a1 and R6a2. As a result, the relays CR9, CR10 and CR11 are successively energized to perform said timer-substituting action described above. Along with this, the relay CR7 is energized to close its normally open contacts R7a1 and R7a2 and to open its normally closed contact R7b. Accordingly, the counter AC2 is energized and steps for counting the number of discontinuous cores. Concurrently, the buzzer BZ is energized to give a warning of the presence of a discontinuity, while the relay CR8 is energized to open its normally closed contact R8b1. Therefore, said electromagnetic relay MC is deenergized to close its normally open contacts MCa1 and MCa2. As a result, the supply of power to said pickup drive motor M is stopped and said motor M is deenergized. Accordingly, the rotary disc 181 is brought to a stop and interrupts the core picking-up operation, and the supply of power to the electrodes N1, P1 and P0 is cut off. In this way, the operation associated with a discontinuity is performed.

In order to re-establish the testing state, the reset push-button PB3 is depressed. Accordingly, its normally closed contacts PB3b1 and PB3b2 are opened, deenergizing the relay CR8. Thus, re-depressing the push-button switch PB1 results in the energization of the electromagnetic relay MC, again allowing the steps of core pickup, pickup confirmation, and testing.

Now, a description will be given of a case where said mode changeover switch SS2 is set for a mode with no automatic stop and the switch SS2 is turned off. In this case, the normal operation in which no discontinuity is detected, is the same as in the case of the automatic stop mode described above. When the relay CR2 is not energized due to the discontinuity of the core 23a (FIG. 4) or other abnormality, the timer T2 is energized upon the lapse of the set time, energizing the relay CR6. Therefore, the relay CR7 is energized and hence the counter AC2 and buzzer are energized. However, the same operation as in the "normal" phase of the automatic stop made continues without the energization of the relay CR8 and without the deenergization of the electromagnetic relay MC.

As the motor M continues being energized, the rotary disc 181 continues rotating, which takes place only during the "normal" phase of the automatic stop mode and in the non-automatic stop mode. As a result, the core 23a confined in the notch 181d of the rotary disc 181 is moved to the core discharging port 172 of the detection unit 18. Therefore, the separator 188 fitted in the annular grooves 181c, 181c of the rotary disc 181 separates this moving core from said notch 181d. At this time the motor M can be stopped by depressing the push-button switch PB2.

In this way, all the cores in the group of core ends 23 are successively picked up one by one by the rotary disc 181, said pickup being confirmed by the spring-like electrode N1, and they are tested for continuity or discontinuity and discharged through the core discharging port 172.

Figure 6:
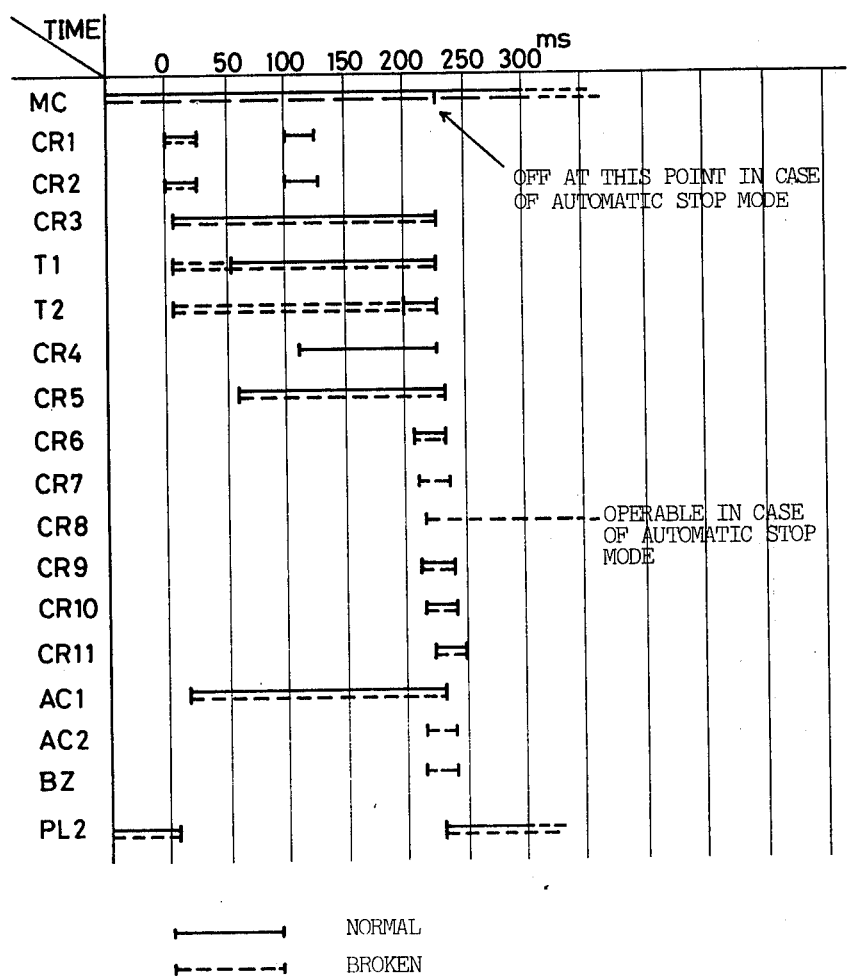
FIG. 6 is a timechart showing the time-dependent operating of the principal parts of FIGS. 5A and 5B.

While the operations of the various parts have so far been described in detail, in order to clarify the relation between the operations based on the individual contacts, a timechart for the operations of the principal parts is shown in FIG. 6.

FIG. 7 is a complete perspective view showing another embodiment of this invention. Mounted on a table 1 is a box containing a power source unit 51, and the lower surface of the table 1 is provided with casters 3. A power switch SS1, a pilot lamp PL1, a mode change-over switch SS2, a voltmeter V1, a counter AC2 and a buzzer BZ, which are provided on the front of the power source unit 51, are the same as those provided on the power source unit 5 shown in FIG. 1 described above. Further, push-button switches PB1, PB2 and PB3, a counter AC1 and a pilot lamp PL2 are the same as those provided on the operating unit 6 shown in FIG. 1 described above. They are given like numerals and a detailed description thereof will be omitted.

Further, a base plate 25 is vertically fixed on the upper surface of the table 1. A flat substantially L-shaped support plate 26 for attaching thereto a pickup unit 28 to be later described in detail is provided on said base plate 25 in substantially the middle of one lateral surface thereof and is vertically and tiltably supported on a shaft 27. Attached to one section of the substantially L-shaped support plate 26 is a block 30 which is also substantially L-shaped. This block 30 supports a pickup drive motor M to be later described and a speed reducer 16 and is adapted to be turned or tilted in unison with said support plate 26. Attached to the end of one section of the block 30 is one end of a rod 31 for separating a group of cores being tested from a group of untested cores, included in the group of core ends 23 of a cable 22 brought to said pickup unit 28. The rod 31 is bent to be substantially L-shape and opposed to said block 30 to define an opening, the other end of said rod being fixed to the end of the other section of said block 30 by a setscrew 32. The various parts on the support plate 26 will be later described in detail with reference to FIGS. 8A and 8B.

Disposed below the support plate 26 of said base plate 25 are a motor M2 for turning or tilting said support plate 26, a speed reducer 33 and a bearing block 34. A tilting mechanism for the support plate 26 will be later described in detail with reference to FIG. 10.

Similarly, under the support plate 26, a grip arm 35 for collectively gripping the ends of the cores being tested out of the group of core ends 23 is tiltably attached by a pin 36. The grip arm 35 is made of a heavy material, e.g., iron, and is formed at one end thereof with clamp members 35a and 35b. One clamp member 35a is fixed while the other clamp member 35b has a movable element 37 associated therewith. Therefore, the group of core ends being tested are gripped or clamped by one clamp member 35a and the movable element 37. A screw 38 for restraining the movable element 37 is provided at the other end of the grip arm 35. In this way, the group of core ends 23 is gripped by the grip arm 35. Since the arm 35 is adapted to be tiltable by the pin 36, as described above, the group of core ends 23 thus gripped is constantly pulled downwardly by the weight of the arm 35 and thus tensioned. Further, the grip arm 35 is urged by the twist force of a coil spring 40 so that its grip portion is turned around a shaft 40a toward the base plate 25, thus pressing the gripped group of core ends 23 against the rotative surface of the rotary disc, not shown, to be later described, of the pickup unit 28. There is provided a spring adjusting screw 41 for varying the twist force of the coil spring 40 according to the core diameter. Further, provided above said pin 35 is a fixing screw 39 for fixing the turning of the grip arm 35.

Further, a window 25a is formed in the upper region of the support plate 26 on the base plate 25, and located above said window 25a is a clamp member 42 serving to grip the near ends of the cable 22 and having a U-shaped opening. The clamp member 42 cooperates with a belt 43 associated therewith to grip the cable 22.

The group of core ends 24 of the cable 22 is immersed in an electrically conductive liquid contained in an electrode vessel 19, as in FIG. 1. Further, the electrode vessel 19 is clamped by an common electrode N0, which is connected to said power source unit 51 through a cable 20.

Figure 8A:
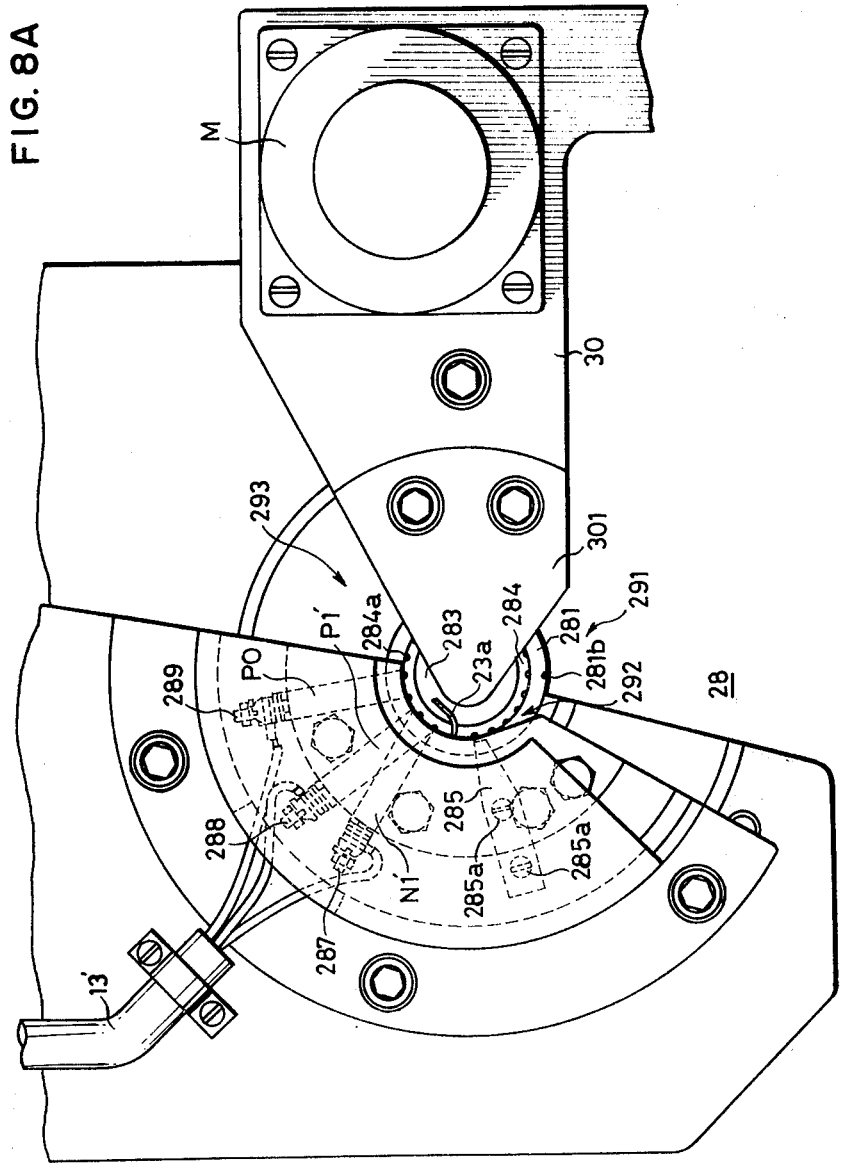

Referring to FIGS. 8A and 8B, the principal parts associated with the pickup unit 28 in this embodiment will now be described in more detail. The block 30 is secured on one section of the support plate 26, as described above. The pickup drive motor M and the speed reducer 16 connected thereto are fixed on one side of the block 30. The block 30 is formed with a through-hole through which the rotary shaft 161 of the motor M and hence of the speed reducer 16 extends and a clearance through which a belt 163 to be later described travels. A block plate 301 is provided on the other side of the block 30 for defining the ends of a core charging port 291 and a core discharging port 293 to be later described. A rotor 283 which is fitted on a shaft 282 is attached below the block plate 301.

The rotary shaft 161 of said speed reducer 16 has a pulley 162 secured thereto. Further, the rotor 283 attached to said block plate 301 has a similar pulley (not shown) secured thereto. The belt 163 is entrained around these two pulleys. Further, fitted on said rotor 283 is a ring 284 which is made, e.g., of rubber and whose periphery is formed with grooves 284a, 284a and so on which are slightly smaller than the diameter of cores to be picked up. A rotary disc 281 to be later described is secured to the lower portion of the rotary shaft 282. Therefore, the torque of the motor M is securely transmitted to the rotor 283, and by the rotation of the motor M the rubber ring 283 and rotary disc 281 are driven for rotation.

Figure 9:
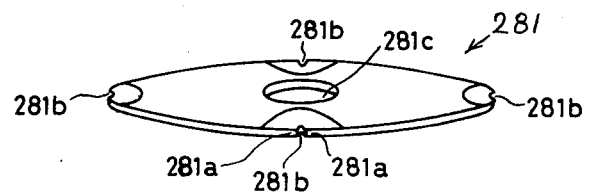
FIG. 9 is a perspective view showing a rotary disc 281 of this further embodiment.

The outer periphery of said rotary disc 281, as shown in FIG. 9, is formed with notches 281b, 281b and so on which are four in number, which number is determined for the same reason as in the case of the above described disc 181. The edges 281a, 281a defining the notch 281b are gradually thinned and rounded toward said notch 281b. The rotor 283 is inserted and fixed in the center 281c of the rotary disc 281. It will be readily understood that this rotary disc 281, like the above described disc 181, functions to separate and pickup cores one by one as it is rotated.

Further, a block 286 is provided on the lower surface of the other section of said support plate 26 with a small clearance defined between its front end and the outer periphery of said rotary disc 281, and a cutter 285 is attached to the upper surface of said block 286. This cutter 285 severs a core picked up by said rotary disc 281. To this end, the position of the tip of the cutter is controlled by position adjusting screws 285a, 285a so that the tip projects inwardly beyond the circumference of said disc 281.

The upper surface of the cutter 285 is covered with an insulating cover 29a attached to the upper surface of said support plate 26. The front end of the cover 29a is substantially at the same position as the tip of said cutter 285 and a step-like clearance is defined thereabove. Therefore, as described above, the cut end of the core 23a cut by said cutter 285 is movable as confined in said clearance. Disposed on the upper surface of the insulating cover 29a is a bladed electrode N1'. The bladed electrode N1' cooperates with a bladed electrode P1' to detect whether or not a core has been picked up, and the tip thereof is positioned with a slight clearance said tip between it and the cutter periphery of the rubber ring 284. For the purpose of positioning the same, it is provided at its rear end with a position adjusting presser bolt 287. Further, a bladed electrode P0 is disposed on the cover 29a at a position adjacent the core discharging port 293 farther away from the bladed electrode N1'. This bladed electrode P0 serves to apply current to a picked-up core for the testing and is provided similarly to said bladed electrode N0'.

An insulating cover 29b cooperates with the cover 29a to bold said two bladed electrodes N1' and P0. A bladed electrode P1' is disposed on the cover 29b with its front and overlapping the bladed electrode N1'. Disposed on the bladed electrode P1' is an insulating cover 29c. Further, an insulating cover 29d covers the exposed electrically conductive portions of the electrodes N1', P1' and P0. In this way, the detection unit 28 is formed by successively stacking the cutter 285, cover 29a, bladed electrodes N1' and P0, cover 29d, bladed electrode P1', cover 29c and cover 29d.

Further, said rubber ring 284, as described above, is formed with a plurality of grooves 284a, 284a and so on spaced apart around the outer periphery thereof. Each groove 284a is substantially rectangular, with the inner diameter thereof somewhat smaller than the outer diameter of the cover on a core to be tested. Therefore, cores separated and picked up from the group of cores by the rotary disc 281 are pushed into the grooves 284a formed in the outer periphery of the rubber ring 284 and are confined therein. Once the cores are pushed into the grooves 284a, they are strongly held by the resilient force of the rubber. In order to push picked-up cores into the grooves 284a of the rubber ring 284, the sides of said insulating covers 29b and 29c adjacent said core charging port 291 define a notch 292 gradually approaching the outer periphery of the rubber ring 284. Therefore, cores picked up by the rotary disc 281 strike the covers 29b and 29c and they gradually are urged against the rubber ring 284 and eventually confined in the grooves 284a.

The electrodes N1', P1' and O0 are connected to the power source unit 51 by a cable 13'.

Figure 10:
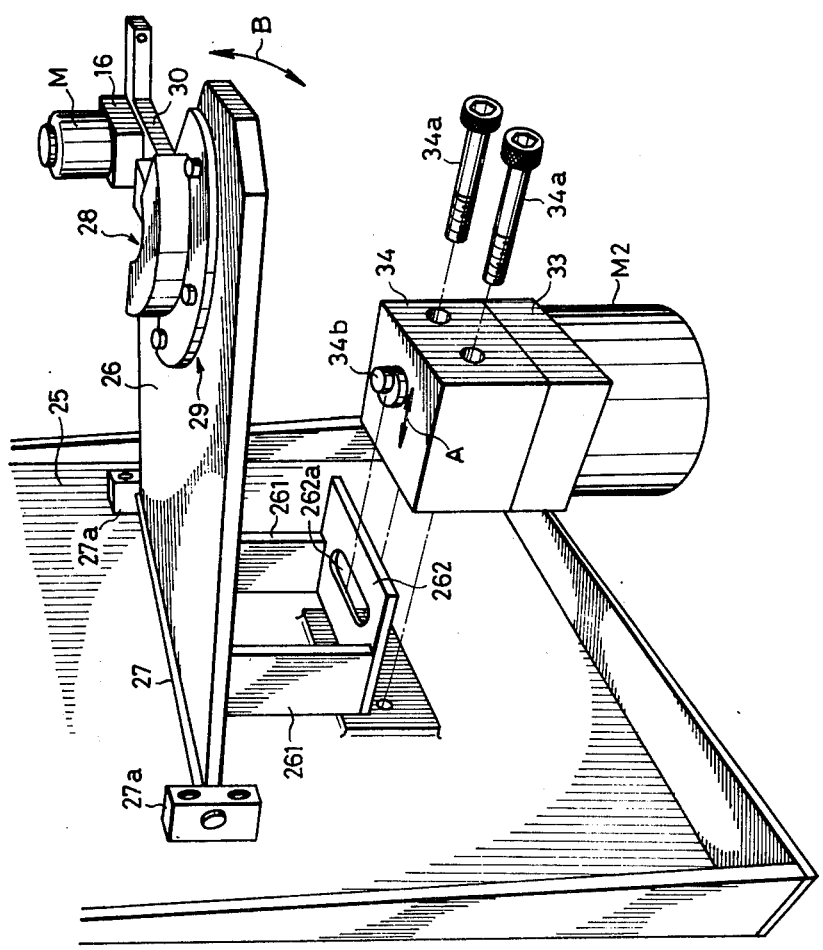
FIG. 10 is a diagrammatic view showing a swinging or oscillating mechanism of this further embodiment.

Thus, the support plate 26 supporting the pickup unit 28 (block 30) is tilted or oscillated by a vertical oscillating mechanism shown in FIG. 10. To this end, the shaft 27 of the support plate 26 is pivotally supported at its both ends by a pair of bearings 27a, 27a provided on the base plate 25. Plate-like members 261, 261 forming a pair are fixed to the lower surface of said support plate 26 adjacent the base plate 25 and a plate-like member 262 is fixed to the other ends of said plate-like members 261, 261 in a bridge fashion. Therefore, these plate-like members 261, 261 and 262 form an integral structure with said support plate 26. Further, the plate-like member 262 is formed with a widthwise extending elongated opening 262a adapted to receive an eccentric disc 34b to be later described.

On the other hand, the swing motor M2 is connected to the speed reducer 33, which, in turn, is connected to the bearing block 34. Rotatably mounted on the upper surface of the bearing block 34 is an eccentric shaft 34b adapted to be driven for rotation by the rotary shaft of said motor M2 (speed reducer 33). When the bearing block 34 is attached to the base plate 25 by bolts 34a, 34a, the eccentric disc 34b is inserted into the elongated opening 262a in the plate-like member 262.

Therefore, when the eccentric disc 34b is rotated by the torque imparted thereto from the motor M2 through the speed reducer 33, the peripheral lateral surface thereof swings in the direction of arrow A. As a result, the plate-like member 262 having said elongated opening 262a engaged with the eccentric shaft 34b also swings in the direction of arrow A. That is, the torque of the motor M2 is converted into a reciprocating motion in the direction of arrow A by the action of the eccentric shaft 34b to swing the plate-like member 262 in the same direction. As a result, the support plate 26 integral with the plate-like member 262 is swung in a vertical direction, i.e. in the direction of arrow B, around the axis of said shaft 27. Therefore, it follows that the rotary disc 281 of the detection unit 28 mounted on the support plate 26 swings lengthwise of the group of near core ends 23 collectively held by the grip arm 35 as described above. Displacing or oscillating the rotary disc 281 and the group of core ends 23 relative to each other in this way makes it very easy to separate and pick up cores one by one from the group of core ends 23. The rate of tilting or oscillating can be varied by the speed changeover switch SS4 according to the diameter or number of cores or the pitch with which they are twisted together. The operation of this embodiment constructed in the manner described above will now be described.

Figure 11:
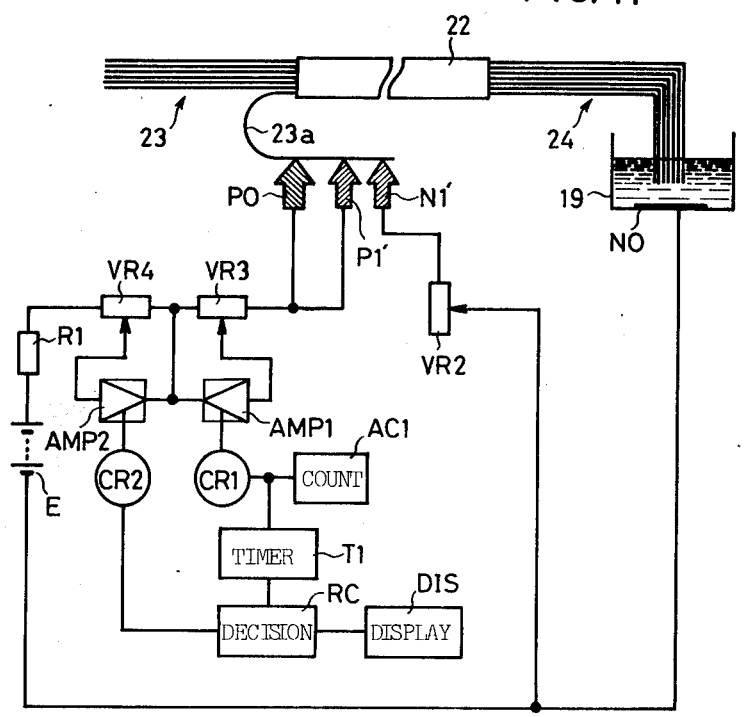
FIG. 11 is a theoretical electric circuit diagram for the explanation of the operation of this further embodiment.

FIG. 11 is an electric circuit diagram for explanation of the operation of this embodiment. The electrical operation of this embodiment is exactly the same as the embodiment shown in FIG. 1, except that the detection of picked-up cores is effected by two bladed electrodes N1' and P1'. Therefore, the control circuit is arranged in the same manner as in FIGS. 5A and 5B and hence a detailed description thereof will be omitted.

First of all, the sheath on the multi-core cable 22 wound on the reel 21 is removed from both ends to expose the groups of core ends 23 and 24. Thereafter, the group of core ends 24 is immersed in the liquid contained in the electrode vessel 19. Along with this, the group of core ends 23, as shown in FIG. 7, is gripped at its front end by the grip arm 35 and at its upper end by the bracket 42 and belt 43. Therefore, by gripping the group of core ends 23 in this manner, the full automation of tests can be achieved.

Subsequently, the motor M is energized. Accordingly, the rotary disc 281 begins rotating while contacting the group of core ends 23 the peripheral surface of which is gripped as described above. As a result, one core 23a (FIG. 11) is picked up by a pickup notch 281b of said disc 281 and reaches the notch 292 defined by said covers 29b and 29c. Therefore, the core 23a is pushed into a groove 284a of the rubber ring 284 and confined therein and it is moved in accordance with the rotation or turning of the rubber ring 284, whereby the core 23a reaches the position of said cutter 285. Accordingly, the core 23a is cut by the cutter 285, as shown in FIG. 8B. As a result, the front end 23a' of the core 23a leaves this position and the core 23a is further moved by the rubber ring 284. Cutting the core in this manner makes it possible to more securely separate and pick up said core 23a from the group of core ends 23 collectively held together.

As described above the separated and picked-up core 23a is further moved in accordance with the rotation of the motor M until it reaches the position of the two bladed electrodes N1' and P1' disposed at the same position as the insulating cover 29 interposed therebetween. Since the tips of these two bladed electrodes N1' and P1' are positioned very close to the outer periphery of said rubber ring 284, they pierces the insulating cover on the core 23a which is moving as confined in the groove 284a of the rubber ring 284, until they simultaneously contact the core conductor. Therefore, the two electrodes P1' and N1' are electrically connected to each other through the conductor of the core 23a to complete a series closed circuit including the power source E, a current restricting resistor R1, and variable resistors VR2, VR3, and VR4. Accordingly, the relay CR1 is energized and a single core 23a having been securely picked up is thereby detected as such.

Further, the rotation of the rubber ring 284 brings the core 23a to the position of the bladed electrode P0 clamped between the insulating covers 29a and 29b. The ensuing operation is the same as in FIG. 4 and a description thereof will be omitted.

In the embodiments of the present invention described above, an arrangement wherein the electrodes P1 and N1 are mechanically opened and closed by the arrival of a core has been shown as means for obtaining a pickup detection signal indicating the arrival of a core. However, other arrangements may be used, including one in which light emitting means and light receiving means, such as a light-emitting diode and a phototransistor, are disposed on both sides of the path of travel of cores so as to obtain a pickup detection signal upon the passage of a core. Yet another possibility may use a proximity switch comprising an oscillation circuit in a compact case and adapted to be on/off controllable as a function of a variation of the oscillation frequency based on a variation of the static capacitance or inductance in response to the approach of a conductor. The proximity switch is disposed along the path of travel of cores so as to obtain a pickup detection signal when a picked-up core conductor travels close by.

Further, while an electrode vessel filled with an electrically conductive fluid has been shown as the means for providing a collective contact for the core ends 24 in the present invention, it is also possible to use solutions of electrolytes, such as common salt and other salts, alkalis and acids, pasty substances or colloidal liquids containing said electrolytes, or low melting point metals melted by being heated by a heater, provided that they exhibit fluidity in use and form a liquid surface when contained in a vessel and that they can electrically contact the conductors of the cores of a cable immersed in the liquid.

In the above embodiments, reference has been made to a test of multi-cable cores for continuity, as an example of an electrical test. However, the quality of cores can also be readily examined with respect to variations of several % in the resistance relative to the standard resistance value by using a molten low melting point metal as an electrically conductive liquid for collectively rendering the group of core ends 24 of a cable conductive, wherein the current flowing through a picked-up core is made dependent solely on the resistance of the conductor of said core, and wherein a measuring circuit is provided which allows a threshold value used for examining the quality to be finely adjusted. Therefore, according to the present invention, it is possible to find not only the presence of a discontinuity in the conductor but also defects such as too small a conductor diameter resulting from the drawing of wires during the manufacturing process whereby an increase in the resistance value is caused. Further, in the case where one end of a cable has already been wired in a station and connected to equipment, it is possible according to the invention to check whether or not the wiring has been completed by testing from the other end of the cable.

The method and apparatus of the present invention so far described in detail are suitable for testing multi-core cables in a factory, but since the pickup unit in the present invention can be sufficiently reduced in size to be portable, it can be used in a narrow space such as a manhole and at the site of outdoor work.

According to the invention, as described above, since the cores of a multi-core cable including a number of cores can be automatically tested one by one for discontinuity, the discontinuity test of cores which has heretofore taken a very long time can be extremely simplified and facilitated. As a result, the test no longer requires many hands, achieving labor saving, and the time required is greately reduced. Thus, the invention is very useful.

Further, in the present invention, whether or not a core has been securely separated and picked up from twisted cores is detected and decided in conjunction with the result of the continuity test, so that a very reliable measurement can be made in which no cores are left untested and no wrong decision is made.

Although this invention has been described and illustrated in detail, it is to be clearly understood that the same is by way of illustration and example only and is not to be taken by way of limitation, the spirit and scope of this invention being limited only by the terms appended claims.

What is claimed is:

1. An apparatus for electrically testing the conductive state of a multi-core cable which includes a plurality of insulated cores each core having a conductor wire and an insulation covering said conductor wire, comprising:

receiving means for receiving said insulated cores at one end of said cable, core pick-up means operatively coupled to said receiving means for picking up said cores one by one at said one cable end, said core pick-up means transferring said picked up core along a predetermined path of travel, said core pick-up means comprising, movable means defining part of said receiving means, said movable means being positioned at said one cable end and having a surface adapted to be in contact with said insulated cores, said movable means being movable along said predetermined path of travel, said surface of said movable means having a notch for receiving one of said plurality of insulated cores, driving means operatively connected to said movable means for driving said movable means, confining means located adjacent said surface of said movable means in opposed relation thereto and extending to a predetermined length along said predetermined path of travel, said confining means having an inlet end forming part of said receiving means and an outlet end, for confining said picked up core in said notch of said movable means while said picked up core is transported from said inlet end to said outlet end, whereby said movable means cooperate with said outlet end of said confining means for withdrawing said picked up core from said notch of said movable means, pick-up detecting means operatively coupled to said core pick-up means and arranged along said path of travel of said core pick-up means for detecting whether or not a core has been picked up by said core pick-up means at said one end of said cable, measuring electrode means disposed along said path of travel of said core pick-up means, spaced from said pick-up detecting means, and adapted to contact the conductor wire of said picked up core at said one end of said cable, said pick-up detecting means and said measuring electrode means being positioned at a predetermined distance from said receiving means and from said withdrawing means, collective conductor means adapted to be in contact with all the core conductor wires of said multi-core cable at the other cable end for collectively rendering conductive all the core conductor wires of said multi-core cable at said other cable end, voltage source means coupled between said measuring electrode means at said one cable end and said collective conductor means at said other cable end for supplying a voltage therebetween, means for detecting the conductive state of said picked up core in said notch of said movable means connected between said measuring electrode means and said collective conductor means, and means coupled to said pick-up detecting means and said measuring electrode means for determining whether or not said picked up core is acceptably conductive, based on a signal from said pick-up detecting means and on a signal from said measuring electrode means, after said picked up core has passed said pick-up detecting means and said measuring electrode means but before said picked up core reaches said outlet end of said confining means, whereby the presence of a defective core may be automatically indicated.

2. The apparatus of claim 1, wherein said pick-up detecting means for detecting whether a core has been picked up and said measuring electrode means are spaced apart from each other in the direction of said path of travel, said measuring electrode means being positioned intermediate said pick-up detecting means and said withdrawing means.

3. The apparatus of claim 1, wherein said pick-up detecting means and said measuring electrode means protrude toward said movable means so that said surface of said movable means may contact a picked up core in said notch of said movable means.

4. The apparatus of claim 1, wherein said movable means comprises a rotary disc and said surface comprises a rotative peripheral surface of said rotary disc.

5. The apparatus of claim 4, wherein said rotary disc includes adjacent to said notch a portion having a smaller thickness than the other portion thereof.

6. The apparatus of claim 4, wherein said rotary disc comprises an annular projection spaced apart from and extending in parallel to the rotative peripheral surface, whereby an annular groove is formed therebetween.

7. The apparatus of claim 6, further comprising means operatively coupled to said groove of said disc for scooping a picked up core from said groove of the surface.

8. The apparatus of claim 1, wherein said notch of said movable means is slightly larger than the diameter of said insulated cores.

9. The apparatus of claim 1, wherein said pick-up detecting means comprises switching means arranged along said predetermined path of travel of said core pick-up means and operable in response to passage of a picked up core.

10. The apparatus of claim 9, wherein said switching means comprises light emitting means provided at a predetermined position on one side of said predetermined path of travel of said core pick-up means, and light sensitive means provided in opposed relation to said light emitting means on the other side of said predetermined path of travel of said core pick-up means.

11. The apparatus of claim 9, wherein said switching means comprises a proximity switch provided at a predetermined position along said predetermined path of travel of said core pick-up 12. The apparatus of claim 9, wherein said switching means comprises a mechanical switching device provided along said predetermined path of travel of said core pick-up means and adapted to be actuated by said picked-up core.

13. The apparatus of claim 9, wherein said pick-up detecting means comprises two pick-up detecting electrode means adapted to contact the conductor of a core picked up by said core pick-up means at two points spaced apart by a relatively short distance on said one end of the core, and means coupled to said two pick-up detecting electrode means for detecting electrical conduction through the conductor portion of the core between said two electrode means.

14. The apparatus of claim 13, wherein said two pick-up detecting electrode means are provided on both sides of said core pick-up means.

15. The apparatus of claim 1, wherein said collective conductor means comprise means for containing an electrically conductive fluid for immersing the cores into said fluid at said other end.

16. The apparatus of claim 1, wherein said conductive state detecting means comprises means for measuring the magnitude of current flowing through said measuring electrodes, through said picked up core conductor and through said collective conductor means.

17. The apparatus of claim 1, wherein said core pick-up means further comprises means operatively coupled to said core pick-up means for cutting said picked up core.

18. A method for electrically testing the conductive state of a multi-core cable having first and second cable ends and including a plurality of insulated cores each comprising a conductor wire and an insulation covering said conductor wire, comprising the steps of collectively rendering said plurality of cores conductive at said second end of said cable while isolating said plurality of cores from each other at said first end of said cable, urging said plurality of insulated cores at said first end against moving means having a notch in a surface thereof for picking up said cores into the notch, one by one at said first end, confining a picked up core in said notch of said moving means by confining means located immediately adjacent said moving means and extending to a predetermined length between an inlet end and an outlet end while said picked up core is being transported from said inlet end to said outlet end, detecting at a first location anywhere between said inlet and outlet end whether or not a core has been picked up at said one end by said notch of said moving means during the time period when said core is confined and transported and providing an electrical signal indicative thereof, detecting at a second location anywhere between said inlet and outlet ends, spaced from said first location, the conductive state of said picked up core between said first and second ends of said core when all cores are collectively rendered conductive and providing an electrical signal indicative thereof, and determining whether or not said picked up core is acceptably conductive before said picked up core reaches said outlet end, said determining being based on the signal indicating the detection of pick-up and the signal indicating the detective conductive state.

19. The method of claim 18, wherein said pick-up detecting step and said conductive state detecting step are carried out during the movement of said movable means when the latter perform said picking up step.

* * * * *

UNITED STATES PATENT OFFICE
CERTIFICATE OF CORRECTION

Patent No. 4,158,167          Dated June 12, 1979

Inventor(s) Shogo Tanno et al

It is certified that error appears in the above-identified patent and that said Letters Patent are hereby corrected as shown below:

--[75] Inventors:    Shogo Tanno, Nishinomiya-shi
Hyogo-ken;
Masateru Hirose, Takarazuka-shi
Hyogo-ken; both of Japan.--.

Claim 11, line 4, after "pick-up" insert -- means. --

Claim 18, line 33, replace "detective" by --detected--.

Signed and Sealed this

Sixteenth Day of October 1979

[SEAL]

Attest:

RUTH C. MASON
Attesting Officer

LUTRELLE F. PARKER
Acting Commissioner of Patents and Trademarks